(12) United States Patent
Hanada et al.

(10) Patent No.: US 11,348,948 B2
(45) Date of Patent: May 31, 2022

(54) MANUFACTURING METHOD OF A DISPLAY DEVICE

(71) Applicant: Japan Display Inc., Tokyo (JP)

(72) Inventors: Akihiro Hanada, Tokyo (JP); Yohei Yamaguchi, Tokyo (JP); Hirokazu Watanabe, Tokyo (JP); Isao Suzumura, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/931,454

(22) Filed: Jul. 17, 2020

(65) Prior Publication Data

US 2020/0350341 A1 Nov. 5, 2020

Related U.S. Application Data

(63) Continuation of application No. PCT/JP2018/044515, filed on Dec. 4, 2018.

(30) Foreign Application Priority Data

Jan. 26, 2018 (JP) .............................. JP2018-011464

(51) Int. Cl.
*H01L 21/00* (2006.01)
*H01L 27/00* (2006.01)
(Continued)

(52) U.S. Cl.
CPC ........ *H01L 27/1225* (2013.01); *G02F 1/1368* (2013.01); *H01L 27/127* (2013.01);
(Continued)

(58) Field of Classification Search
CPC ............... G02F 1/1368; G02F 1/13685; G02F 1/133305; G09F 9/30; G09F 9/00;
(Continued)

(56) References Cited

U.S. PATENT DOCUMENTS 10,453,965 B2 * 10/2019 Yamaguchi ......... H01L 27/1222
2011/0180802 A1 7/2011 Morosawa et al.
(Continued)

FOREIGN PATENT DOCUMENTS

| JP | 2012-015436 A | 1/2012 |
| JP | 2015-092638 A | 5/2015 |
| WO | 2010/041686 A1 | 4/2010 |

OTHER PUBLICATIONS

International Search Report and Written Opinion dated Feb. 26, 2019 for PCT/JP2018/044515 filed on Dec. 4, 2018, 9 pages including English Translation of the International Search Report.

*Primary Examiner* — Nikolay K Yushin
(74) *Attorney, Agent, or Firm* — Xsensus LLP

(57) ABSTRACT

The purpose of the present invention is to realize the display device having thin film transistors of the oxide semiconductor of stable characteristics. An example of the concrete structure is that: A display device having a substrate including a display area, plural pixels formed in the display area, the pixel includes a first thin film transistor having an oxide semiconductor film, a first insulating film made of a first silicon oxide on a first side of the oxide semiconductor film, a second insulating film made of a second silicon oxide on a second side of the oxide semiconductor film, wherein oxygen desorption amount per unit area from the first insulating film is larger than that from the second insulating film, when measured by TDS (Thermal Desorption Spectrometry) provided M/z=32 and a measuring range in temperature is from 100 centigrade to 500 centigrade.

3 Claims, 11 Drawing Sheets

(51) Int. Cl.
 *H01L 29/00* (2006.01)
 *H01L 27/12* (2006.01)
 *G02F 1/1368* (2006.01)
 *H01L 27/32* (2006.01)
 *H01L 21/02* (2006.01)

(52) U.S. Cl.
 CPC ...... *H01L 27/1237* (2013.01); *H01L 27/1251* (2013.01); *H01L 27/3244* (2013.01); *G02F 1/13685* (2021.01); *H01L 21/02164* (2013.01); *H01L 21/02271* (2013.01); *H01L 27/1218* (2013.01); *H01L 27/1248* (2013.01)

(58) Field of Classification Search
 CPC ..... G09F 9/03; G09F 9/301; H01L 21/02274; H01L 21/02271; H01L 21/02164; H01L 27/1225; H01L 27/1251; H01L 27/127; H01L 27/3244; H01L 27/1237; H01L 27/3262; H01L 27/1218; H01L 27/1248; H01L 29/78648; H01L 29/7869; H01L 29/41733; H05B 33/10; H05B 33/14; H05B 33/22; H05B 33/04; H05B 33/02; H05B 33/28; H05B 33/12; H05B 33/24
 See application file for complete search history.

(56) References Cited

U.S. PATENT DOCUMENTS

| | | |
|---|---|---|
| 2012/0001167 A1 | 1/2012 | Morosawa |
| 2015/0194535 A1 | 7/2015 | Yamazaki et al. |
| 2018/0286888 A1* | 10/2018 | Yamaguchi ......... H01L 27/1222 |

* cited by examiner

MANUFACTURING METHOD OF A DISPLAY DEVICE

The present application is a continuation application of International Application No. PCT/JP2018/044515, filed on Dec. 4, 2018, which claims priority to Japanese Patent Application No. 2018-011464, filed on Jan. 26, 2018. The contents of these applications are incorporated herein by reference in their entirety.

BACKGROUND OF THE INVENTION

(1) Field of the Invention

The present invention relates to the display device that uses oxide semiconductor TFTs.

(2) Description of the Related Art

The organic EL display device and the liquid crystal display device use thin film transistors (TFT: Thin Film Transistor) for switching elements or driving TFTs in a driving circuit. The a-Si (amorphous Silicon), the LTPS (Low Temperature Poly Silicon), the oxide semiconductor and so forth are used for the TFTs.

Since a mobility of carriers in a-Si is low, it is difficult to constitute the driving circuit by TFTs of a-Si. A mobility of carriers in LTPS is high, therefore TFTs of LTPS can be used for the peripheral driving circuit; however, TFTs of LTPS have a problem of large leak current when they are used as switching elements. The oxide semiconductor has larger mobility than a-Si and leak current is low; however, there is a problem of reliability in controlling lattice defects in the semiconductor film.

Patent document 1 discloses to cover the whole TFT of the oxide semiconductor including the gate electrode by inorganic insulating film of e.g. the aluminum oxide film, the titanium oxide film, or the indium oxide film.

Patent document 2 discloses to suppress the gate leak current due to tunnel effect when the gate insulating film is made thin to improve performance of the TFT of the oxide semiconductor. It discloses, for the gate insulating film, to use materials of high dielectric constant such as hafnium oxide, tantalum oxide and so forth, in addition to that, to laminate a film such as a silicon oxide film, a silicon nitride film, or an aluminum oxide film and so forth.

Patent document 3 discloses to sandwich the channel of the oxide semiconductor film by inorganic insulating films to stabilize the characteristics of the TFT of the oxide semiconductor. The inorganic film is made of the aluminum oxide, the titanium oxide, or the indium oxide.

PRIOR ART DOCUMENTS

Patent Document

Patent document 1: Japanese patent application laid open No. 2012-15436
Patent document 2: Japanese patent application laid open No. 2015-92638
Patent document 3: WO 2010/041686

SUMMARY OF THE INVENTION

Since the TFT of the oxide semiconductor has a low leak current, fluctuation in the pixel voltage can be suppressed; therefore, low frequency operation can be possible. Consequently, power consumption in the display area can be decreased. In addition, a mobility of carrier in the oxide semiconductor is higher ten times or more than that of the a-Si, thus, TFTs of the oxide semiconductor can operate in higher speed than that of the a-Si.

Further, the oxide semiconductor film can be formed in lower temperature compared with the poly-Silicon. Consequently, the TFT of the oxide semiconductor can be formed on the resin substrate as e.g. polyimide substrate.

In order to stabilize the characteristics of the oxide semiconductor, the oxide semiconductor needs to securely maintain oxygen. For that purpose, the gate insulating film made of silicon oxide (herein after represented by SiO), which directly contacts with the oxide semiconductor, needs to supply oxygen to the oxide semiconductor. The SiO film that can supply oxygen has a lot of lattice defects. When the gate voltage of ON/OFF is repeatedly applied to such a gate insulating film from the gate electrode, the property of the gate insulating film changes; consequently, characteristics of the TFT changes; as a result, the threshold voltage of the TFT changes.

In order to avoid that kind of fluctuation in characteristics of the gate insulating film, the gate insulating film needs to be a dense film that has less lattice defects. Such a dense SiO film, however, cannot supply enough oxygen to the oxide semiconductor; consequently, the characteristics of the oxide semiconductor change, therefore, the characteristics of TFT change.

Such a dilemma must be overcome to realize the TFT of the oxide semiconductor having high reliability. The purpose of the present invention is to overcome the dilemma, explained above, and to realize the oxide semiconductor TFT of high reliability, and thus, to realize display device, using such TFTs, of high display quality and high reliability.

The present invention solves the above explained problems; the concrete measures are as follows.

(1) A display device having a substrate including a display area,
plural pixels formed in the display area,
the pixel includes a first thin film transistor having an oxide semiconductor film,
a first insulating film made of a first silicon oxide on a first side of the oxide semiconductor film,
a second insulating film made of a second silicon oxide on a second side of the oxide semiconductor film,
wherein oxygen desorption amount per unit area from the first insulating film is larger than that from the second insulating film,
when measured by TDS (Thermal Desorption Spectrometry) provided M/z=32 and a measuring range in temperature is from 100 centigrade to 500 centigrade.

(2) A manufacturing method of a display device having a substrate including a display area, in which plural pixels are formed, each of the pixels including a TFT having an oxide semiconductor film comprising:
forming a first insulating film in contact with a first side of the oxide semiconductor film,
forming a second insulating film in contact with a second side of the oxide semiconductor film,
forming the first insulating film by a first CVD, in which the substrate is in a first temperature,
forming the second insulating film by a second CVD, in which the substrate is in a second temperature,
wherein the second temperature is higher than the first temperature.

(3) A manufacturing method of a display device having a substrate including a first thin film transistor having a polysilicon semiconductor film, and a second thin film transistor having an oxide semiconductor film comprising:

forming the first thin film transistor at first, subsequently, forming a first gate insulating for the second thin film transistor, which is formed at different place from the first thin film transistor in a plan view, by a first CVD, in which the substrate is in a first temperature, forming the oxide semiconductor film on the first gate insulating film, forming a second gate insulating film on the oxide semiconductor film by a second CVD, in which the substrate is in a second temperature, the second temperature is higher than the first temperature.

DETAILED DESCRIPTION OF THE PREFERRED EMBODIMENTS

The flexible liquid crystal display device or the flexible organic EL display device, which can be bent or curved, are expected to be realized. The substrate of the display device, which can be bent or curved, is made of resin, e.g. polyimide. The polyimide that is transparent in visible light region (herein after, simply, polyimide) changes its property when temperature exceeds 350 centigrade, therefore, the process temperature in manufacturing the display device having polyimide needs to be 350 centigrade or less.

The a-Si, which has been used conventionally, is formed by low temperature process; however, its mobility of carriers is low as e.g. 1 $cm^2/Vs$, further, it is difficult to control the shift of threshold voltage. The LTPS has a high carrier mobility, however, a temperature of heat process is 400 centigrade or more in the manufacturing process to form a stable and high quality LTPS TFT. In contrast, the TFT of the oxide semiconductor can realize a carrier mobility of 10 $cm^2/Vs$ by low temperature manufacturing process of 350 centigrade or less.

The present invention can be applicable to such a display device having a resin substrate. The present invention will be explained in detail referring to the following embodiments.

Embodiment 1

Figure 1:
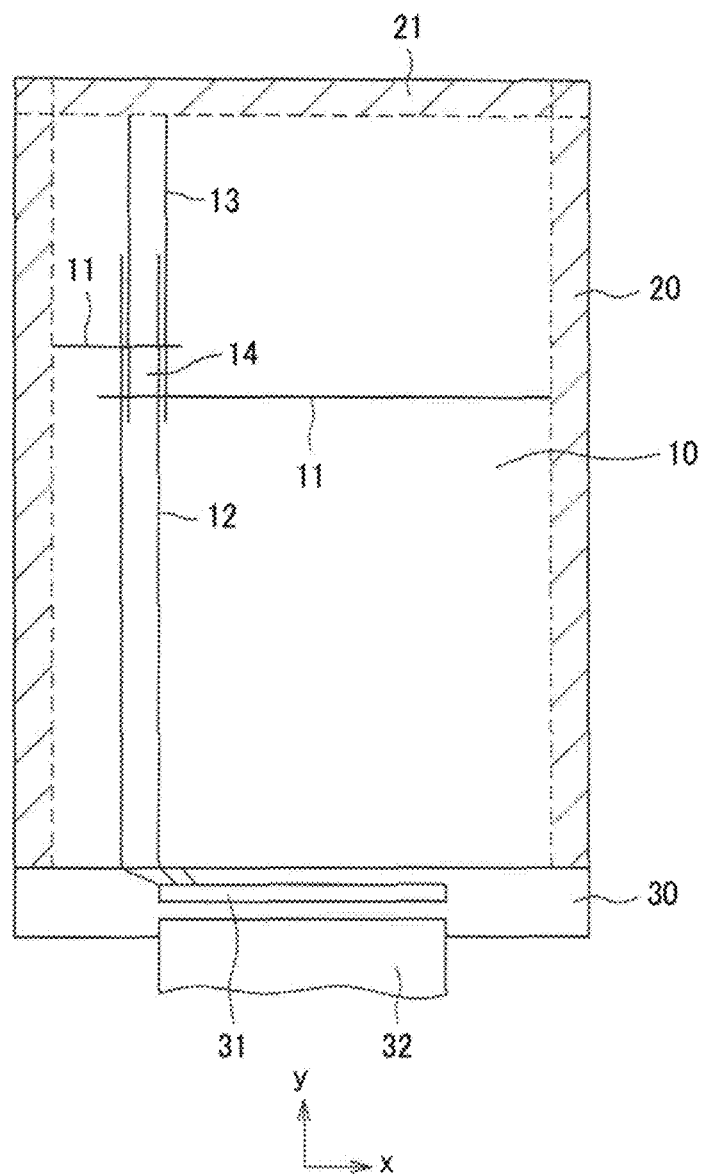
FIG. 1 is a plan view of the organic EL display device.

FIG. 1 is a plan view of the organic EL display device having the flexible substrate 100, to which the present invention is applied. The organic EL display device has the display area 10 and the terminal area 30. In the display area 10, the scan lines 11 extend in the lateral direction (x direction) and are arranged in the longitudinal direction (y direction). The video signal lines 12 and the power lines 13 extend in the longitudinal direction and are arranged in the lateral direction. The pixel 14 is formed in the area surrounded by the scan lines 11 and the video signal lines 12 or the power lines 13.

In FIG. 1, the terminal area 30 is formed in the area where the display area 10 is not formed; the driver IC 31 is installed in the terminal area 30. The video signals are arranged on the driver IC 31 and supplied to the display area 10. Further, the flexible wiring substrate 32 is connected to the terminal area 30 to supply powers and signals to the organic EL display device.

In FIG. 1, the scan line driving circuits 20 are formed at both sides of the display area 10. The current supply region 21 is formed at the top side (upper side in y direction) of the display area 10. The current is supplied to the current bus line from the flexible wiring substrate 32, which connects to the terminal area 30; the current bus line is wired to the current supply region 21, which is located at the top side (upper side in y direction) of the display area 10. Then, the current is supplied to the pixels 14 from the current supply region 21 through the power lines 13. This structure is to avoid a concentration of wirings at the bottom side of the display area 10.

Figure 2:
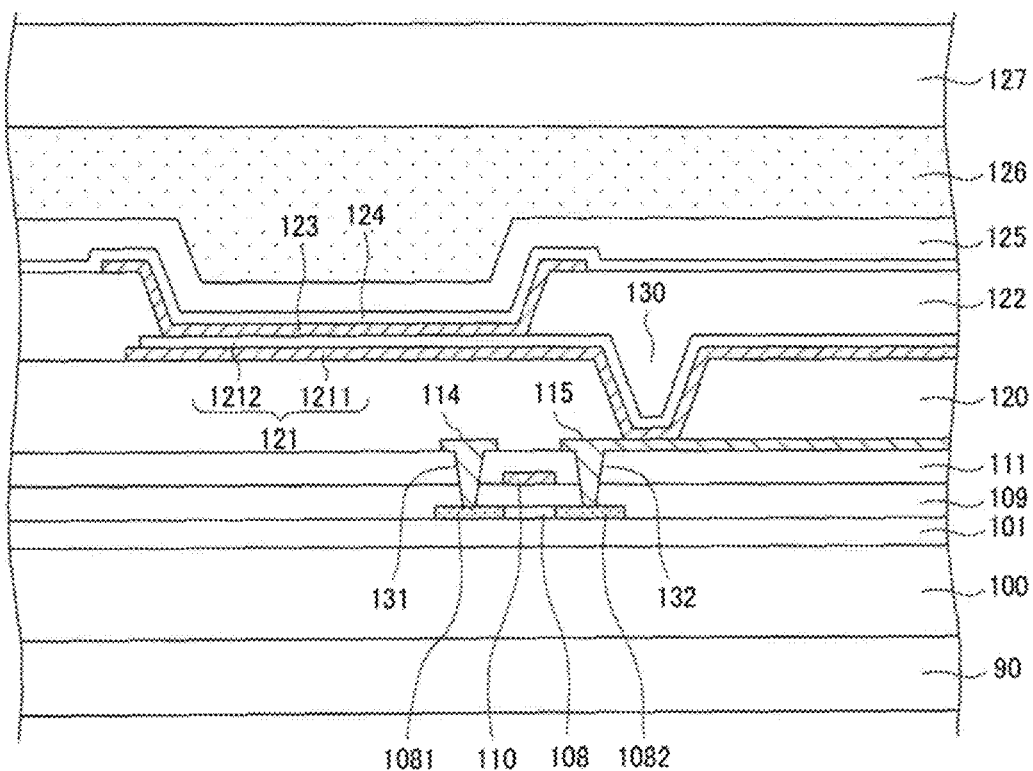
FIG. 2 is a cross sectional view of the display area of the organic EL display device.

FIG. 2 is a cross sectional view that shows the layer structure in the display area 10 of the organic EL display device. FIG. 2 and so forth are explained when the TFT substrate 100 is made of resin; however, principle is the same when the TFT substrate 100 is made of glass. FIG. 2 is for the flexible display device; therefore, the glass substrate 90 is removed when the flexible display device is completed. Namely, the sole resin substrate cannot pass the manufacturing process, therefore, elements for the organic EL display device are formed on the glass substrate 90; after the organic EL display device is completed, the glass substrate 90 is removed from the organic EL display device by laser abrasion, etc.

In FIG. 2, the TFT substrate 100 made of resin is formed on the glass substrate 90. The polyimide is used as the resin. The polyimide has superior characteristics as a substrate of the flexible display device because of its mechanical strength, its heat resistance and so forth. Herein after, the resin substrate means the polyimide substrate.

The material, which includes polyamic acid, for the polyimide is coated by slit coater, rod coater, or inkjet and so forth on the glass substrate 90; then, it is baked to be imidized and solidified. A thickness of the polyimide substrate 100 is 10 to 20 microns. In FIG. 2, the undercoat film 101 is formed on the TFT substrate 100 to prevent the semiconductor film 107 and the organic EL layer 123 from being contaminated by moisture or impurities in the polyimide substrate 100. The undercoat film 101 is e.g. formed by a three layer laminated film, which the silicon nitride (SiN) film is sandwiched by the silicon oxide (SiO) films. In addition, sometimes, the aluminum oxide (AlOx) film is added.

The semiconductor film 108 is formed on the undercoat film 101. The semiconductor film 108 is e.g. made of the oxide semiconductor film. The oxide semiconductor film 108 can be formed at the temperature of 350 centigrade, which the polyimide can endure. Among the oxide semiconductors, optically transparent and amorphous materials are called TAOS (Transparent Amorphous Oxide Semiconductor). Examples of TAOS are indium gallium zinc oxide (IGZO), indium tin zinc oxide (ITZO), zinc oxide nitride (ZnON), indium gallium oxide (IGO), and so forth. In this invention, it is explained that the IGZO is used for the oxide semiconductor film 108

The drain 1081 and the source 1082 are formed in the oxide semiconductor film 108 by ion doping. The gate insulating film 109 is formed covering the oxide semiconductor film 108; the gate electrode 110 is formed on the gate insulating film 109. The gate electrode 110 is made of e.g. MoW and so forth, however, if a low resistance is necessary, a laminated film as the Al film, sandwiched by the Titanium films, or etc. is used. After that, the ion implantation is performed, using the gate electrode 110 as the mask, to form the drain 1081 and the source 1082 in the oxide semiconductor film 108. The channel is formed in the semiconductor film 108 just beneath the gate electrode 110.

The gate insulating film 109, which is made of SiO, has a role to supply oxygen to the oxide semiconductor film 108. The SiO film that has a lot of oxygen has also a lot of lattice defects. The SiO film is formed by CVD (Chemical Vapor Deposition); the SiO film that discharges oxygen is formed by low temperature CVD as 200 to 250 centigrade. Such a gate insulating film 109 tends to change its characteristics when the field formed by gate voltages is applied repeatedly from the gate electrode 110. This causes the change in TFT characteristics as e.g. a change in the threshold voltage. The present invention, which will be explained later, solves this problem.

The interlayer insulating film 111 is formed covering the gate electrode 110. The drain electrode 114 and the source electrode 115 are formed on the interlayer insulating film 111. The through holes 131 and 132 are formed in the interlayer insulating film 111 and the gate insulating film 109; the drain electrode 114 and the drain 1081 are connected via the through hole 131, and the source electrode 115 and the source 1082 are connected via the through hole 132.

The organic passivation film 120 is formed covering the drain electrode 114, the source electrode 115, and the interlayer insulating film 111. The organic passivation film 120 is made of transparent resin as acrylic resin. The organic passivation film 120 has also a role as a flattening film, therefore, it is made thick as 2 to 4 microns.

A laminated film of the reflection film 1211 and the anode 1212 is formed on the organic passivation film 120. The laminated film of the reflection film 1211 and the anode 1212 is called the lower electrode 121. The reflection film 1211 is made of e.g. silver, which has a high reflectance, and the anode 1212 is made of ITO (Indium Tin Oxide). The through hole 130 is formed in the organic passivation film 120 to connect the source electrode 115 and the lower electrode 121.

The bank 122 is formed covering the lower electrode 121. The bank 122 is made of transparent resin as acrylic resin. The role of the bank 122 is to form a step coverage to prevent a breaking of the organic EL layer 123 at the edge of the lower electrode 112 as well as to partition the pixels 14.

The organic EL layer 123 is formed in the hole formed in the bank 122. The organic EL layer 123 is a laminated film comprising e.g., from lower side, the hole injection layer, the hole transport layer, the light emitting layer, the electron transport layer, the electron injection layer, and so forth. A thickness of each layers is very thin as several nm to 100 nm.

The upper electrode 124, which is a cathode, is formed covering the organic EL layer 123. The cathode 124 is formed on all over the display area 10 in common to pixels. The cathode 124 is made of the transparent conductive film of e.g. ITO, IZO (Indium Zinc Oxide), AZO (Antimony Zinc Oxide) and so forth or a thin film of metal as silver, etc.

After that, the protective film 125 is formed covering the cathode 124 to prevent intrusion of moisture. The protective film 125 is made of SiN formed by CVD. The protective film 125 is formed by low temperature CVD as 100 centigrade since the organic EL layer 123 is weak to heat. The protective film 125 may be laminated by a transparent resin film made of e.g. acrylic resin for mechanical protection.

Since the organic EL display device of top emission type has reflection electrodes 1211, the external light is reflected from the screen. Therefore, the organic EL display device has the polarizing plate 127 adhered to the display surface to prevent the reflection of the external light. The polarizing plate 127 has the adhesive 126, which is pressure bonded to the organic EL display device. A thickness of the adhesive 126 is e.g. 30 microns and a thickness of the polarizing plate 127 is e.g. 100 microns.

As described above, the flexible display device is formed on the glass substrate 90; subsequently, the laser beam is irradiated at the interface between the TFT substrate 100 and the glass substrate 90 to remove the glass substrate 90 form the TFT substrate 100. As a result, the flexible display device having a resin substrate is completed.

Figure 3:
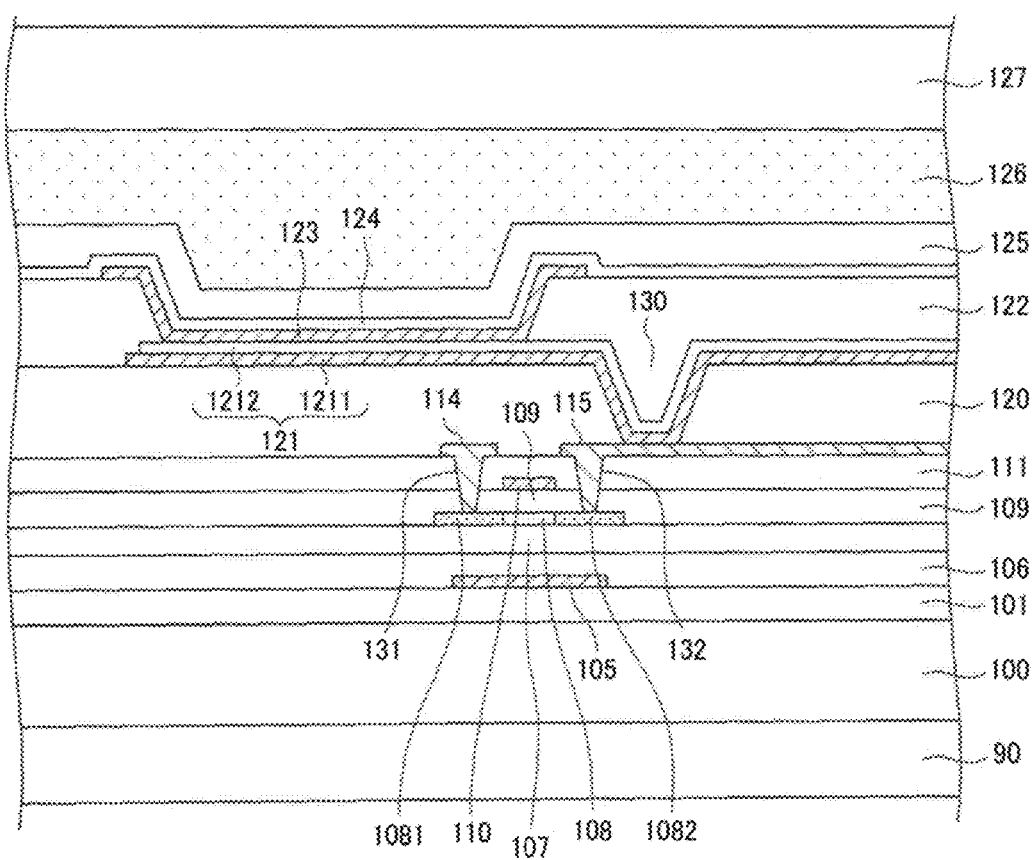
FIG. 3 is a cross sectional view of the display area of the organic EL display device according to the present invention.

FIG. 3 is a cross sectional view of the organic EL display device that the fluctuation in the characteristics of the TFT of the oxide semiconductor 108 due to the gate insulating film 109 is counter measured. FIG. 3 differs from FIG. 2 from the undercoat film 101 through the second gate insulating film 110 (corresponding to the gate insulating film in FIG. 2). In FIG. 3, the first gate electrode 105 is formed on the undercoat film 101. The first gate electrode 105 is formed by e.g. MoW, which is the same material as the second gate electrode 110.

The barrier film 106, which is made of silicon nitride (herein after represented by SiN), is formed covering the first gate electrode 105 in a thickness of e.g. 100 nm. The barrier film 106 prevents the oxide semiconductor film 108 from being contaminated and deteriorated by moisture, which intrudes from e.g. the TFT substrate 100. In FIG. 3, if the undercoat film 101 has a barrier film made of SiN, the barrier film 106 may be omitted. The first gate insulating film 107 is formed by SiO on the barrier film 106 in a thickness of e.g. 200 nm or more. The first gate insulating film 107 has comparatively larger lattice defects and supplies oxygen to the oxide semiconductor film 108, which is made on the first gate insulating film 107.

A combination of the barrier film 106 and the first gate insulating film 107 can be called as the gate insulating film; however, in this specification, they are called separately for convenience. The first gate electrode 105 has a role as a light shielding film for the oxide semiconductor film 108, which is made above the first gate electrode 105. By the way, the first gate electrode 105 may be used only for the light shading film; in that case, a reference voltage is applied to the first gate electrode 106, or the first gate electrode 105 is made electrically float.

The oxide semiconductor film 108 is formed on the first gate insulating film 107. The structure of the oxide semiconductor film 108 is the same as explained in FIG. 2. In FIG. 3, the second gate insulating film 109 is formed covering the oxide semiconductor film 108. The second gate insulating film 109, which is made of SiO, is a dense film having less lattice defects. The second gate insulating film 109 also is formed by CVD, however, the temperature of CVD is 300 to 350 centigrade, which is higher than the CVD for the first gate insulating film 107.

The change in the characteristics of the second gate insulating film 109 is small since the SiO which constitutes the second gate insulating film 109 is a dense film; therefore, a change in characteristics of the TFT can be made small. On the other hand, since the second gate insulating film is a dense film, it cannot supply enough oxygen to the oxide semiconductor film 108. In the structure of FIG. 3, however, the first gate insulating film 107, which is made of SiO that has a lot of lattice defects, can supply oxygen to the oxide semiconductor film 108, thus, the characteristics of the oxide semiconductor film 108 is preserved, and the change in the characteristics of the TFT can be avoided.

A thickness of the second gate insulating film 109 is e.g. 100 nm. On the contrary, a thickness of the first insulating film 107 is e.g. 200 nm. In addition, there is the barrier film 106, which is formed in a thickness of 100 nm between the first gate electrode 105 and the first gate insulating film 107. Therefore, even if the same gate voltage is applied to the first gate electrode 105 and to the second gate electrode 110, the second gate electrode 110 has a major role to the characteristics of the TFT. Thus, even if the characteristics of the first gate insulating film 107 changes, it does not cause a major change in the TFT characteristics. In addition, the electric field applied to the first gate insulating film 107 is low, therefore, a change in the characteristics of the first gate insulating film 107 is less likely to occur.

When a thickness of the first gate insulating film 107 is made thicker than 200 nm, the influence of the first gate electrode 105 can be made less; in addition, a supply of oxygen from the first gate insulating film 107 to the oxide semiconductor film 108 increases. If it is desired to further decrease the influence of the first gate insulating film 107, the gate voltage to the first gate electrode 105 can be made less than the gate voltage to the second gate electrode 110.

Figure 4:
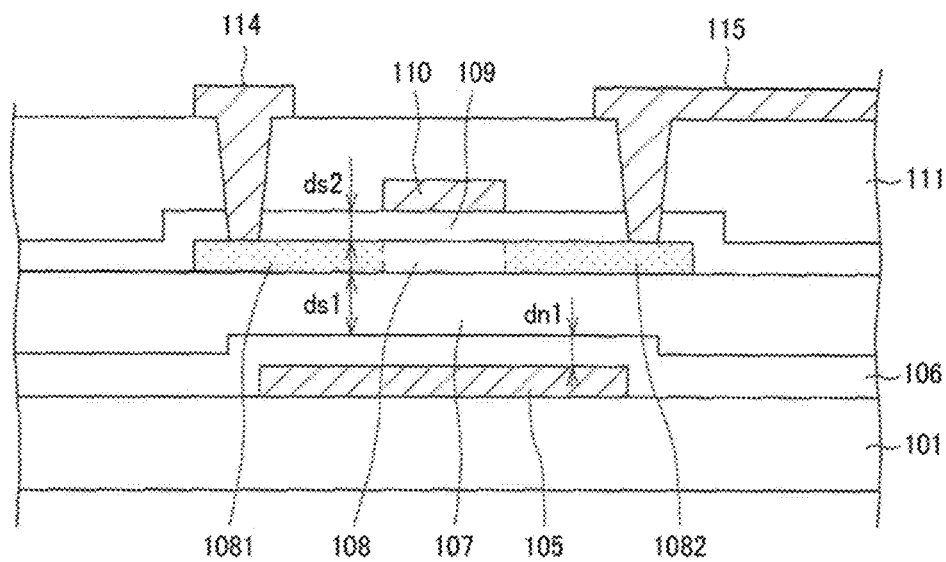
FIG. 4 is a cross sectional view of the TFT and its vicinity according to the present invention.

FIG. 4 is an enlarged cross sectional view of FIG. 3 at the TFT and its vicinity. In FIG. 4, the barrier film 106 made of SiN is formed covering the first gate electrode 105; the first gate insulating film 107, which has relatively large density of lattice defects, is formed on the barrier film 106. The oxide semiconductor film 108 is formed on the first gate insulating film 107; the second gate insulating film 109, which is made of dense SiO film, is formed covering the oxide semiconductor film 108.

The second gate electrode 110 is formed on the second gate insulating film 109. The drain 1081 and the source 1082 are formed in the oxide semiconductor film 108 by doping e.g. Argon (Ar), phosphorus (P), or Boron (B) by ion implantation using the second gate electrode 110 as the mask. The channel is formed in the oxide semiconductor film 108 directly below the second gate electrode 110.

In FIG. 4, a thickness dn1 of the SiN film 106, which covers the first gate electrode 105, is e.g. 100 nm. A thickness ds1 of the first gate insulating film 107, which is made of SiO film having a lot of lattice defects, is e.g. 200 nm. A thickness ds2 of the second gate insulating film 109, which is made of dense SiO film, is e.g. 100 nm. Therefore, the second gate electrode 110 has a major influence to the characteristics of the TFT. By the way, a thickness of the first gate insulating film 107 is preferably 200 nm or more. The ratio ds1/ds2 is preferably 2 or more, and ds1>dn1.

The first gate insulating film 107 is formed by CVD. The condition of the CVD to form the first gate insulating film 107 is e.g.: the gas flow ratio is $N_2O/SiH_4 \leq 50/1$, input power to the plasma is 0.15 $W/cm^2$ or more, pressure is 200P to 300P, the temperature of the substrate is 200 to 250 centigrade. The second gate insulating film 109 is also formed by CVD, in which the temperature of the substrate is 300 to 350 centigrade, but other conditions are the same as the CVD for the first gate insulating film 107. Namely, the difference in the characteristics between the first gate insulating film 107 and the second gate insulating film 109 can be controlled by the temperature of the substrate during the CVD.

Figure 5:
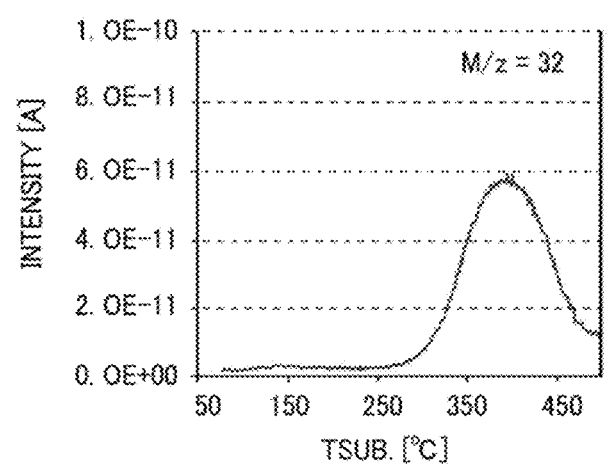
FIG. 5 is a graph of desorption amount of oxygen from the first gate insulating film in TDS measuring.

FIG. 5 is a discharged amount of oxygen from the first gate insulating film 107, measured by TDS (Thermal Desorption Spectrometry) when the first gate insulating film 107 is formed by the CVD under the condition that the temperature of the substrate is 230 centigrade. In FIG. 5, the ordinate is an intensity according to the oxygen molecules; the unit is ampere; the abscissa is a temperature (centigrade) of the substrate. In FIG. 5, the amount of discharge of oxygen increases drastically when the temperature of the substrate becomes higher than 250 centigrade. In FIG. 5, the oxygen desorption amount is $1.2 \times 10^{14}$ molecules/$cm^2$ at M/z=32, and under the temperature between 100 and 500 centigrade. The oxygen desorption amount of the first gate insulating film 107 is preferably $1.0 \times 10^{14}$ molecules/$cm^2$ or more.

Figure 6:
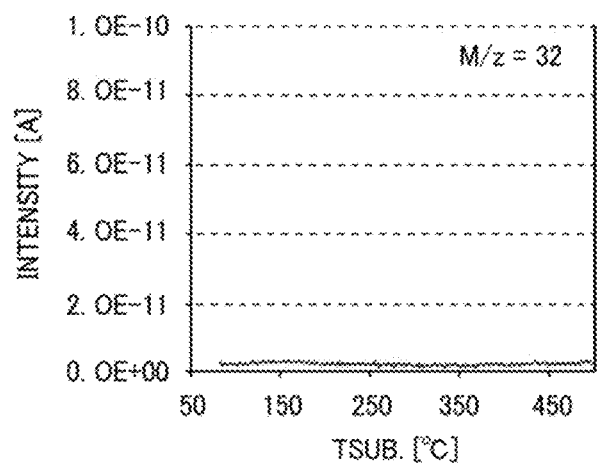
FIG. 6 is a graph of desorption amount of oxygen from the second gate insulating film in TDS measuring.

FIG. 6 is a discharged amount of oxygen from the second gate insulating film 109, measured by TDS (Thermal Desorption Spectrometry) when the second gate insulating film 109 is formed by the CVD under the condition that the temperature of the substrate is 300 centigrade. In FIG. 6, the ordinate is an intensity according to the oxygen molecules; the unit is ampere; the abscissa is a temperature (centigrade) of the substrate. In FIG. 6, the amount of discharge of oxygen does not increase even the temperature of the substrate becomes higher than 400 centigrade. In FIG. 6, the oxygen desorption amount is $1.5 \times 10^{13}$ molecules/$cm^2$ at M/z=32, and under the temperature between 100 and 500 centigrade. The oxygen desorption amount of the second gate insulating film 109 is preferably $1.5 \times 10^{13}$ molecules/$cm^2$ or less.

The above data are characteristics of the first gate insulating film 107 and the second gate insulating film 109, which are included in the completed display device. The SiO film that has a lot of lattice defects discharges gases absorbed during the CVD process in the TDS test. In measuring the characteristics of the first gate insulating film 107 and the second gate insulating film 109 in the completed display device by TDS method, the upper layers above the first gate insulating film 107 or above the second gate insulating film 109 are removed to expose the first gate insulating film 107 or the second gate insulating film 109.

As described above, the roles are shared in the first gate insulating film 107 and the second gate insulating film 109, therefore, the TFT of the oxide semiconductor of high reliability can be realized.

Figure 7:
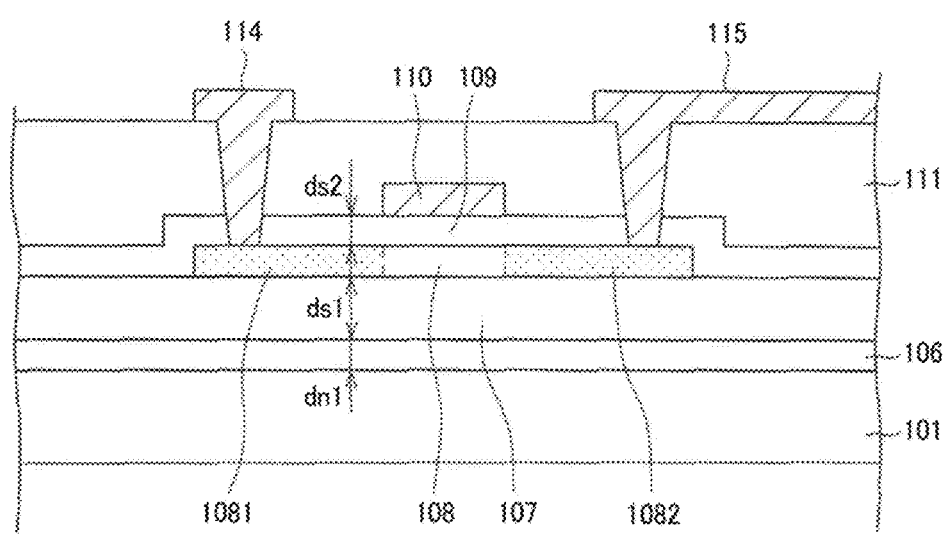
FIG. 7 is a cross sectional view of a second example of embodiment 1.

The structure of the TFT of the oxide semiconductor is not limited to the structure of FIG. 4, but other structures can be taken according the purpose. FIG. 7 is a cross sectional view of the TFT according to a second example of embodiment 1. In FIG. 7, the first gate electrode 105 does not exist, and the TFT is driven by only the second gate electrode 110. In FIG. 7, the barrier film 106, made of SiN, is formed in a thickness of dn1 on the undercoat film 101; the SiO film 107, which is first gate insulating film, is formed in a thickness of ds1 on the barrier film 106.

In FIG. 7, the oxide semiconductor film 108 is formed on the SiO film 107. The gate insulating film 109 is formed in a thickness of ds2 over the oxide semiconductor film 108. The thicknesses of ds1, ds2, and dn1, as well as the relations between the thicknesses of those films are the same as explained in FIG. 4. In FIG. 7, the barrier film 106 can be omitted when the undercoat film 101 includes the SiN film as a barrier film. The SiO film 107, however, cannot be omitted.

However, the upper most film of the undercoat film 101 is made of SiO film and the thickness is 200 nm or more, the upper most film of the undercoat film 101 can substitutes the SiO film 107. In this case, the SiO film of the upper most film of the undercoat film 101 is preferably formed by the same manufacturing condition as explained in FIG. 4 for the first gate insulating film 107; and the characteristics of the upper most film of the undercoat film 101 should have characteristics explained in FIG. 5.

Figure 8:
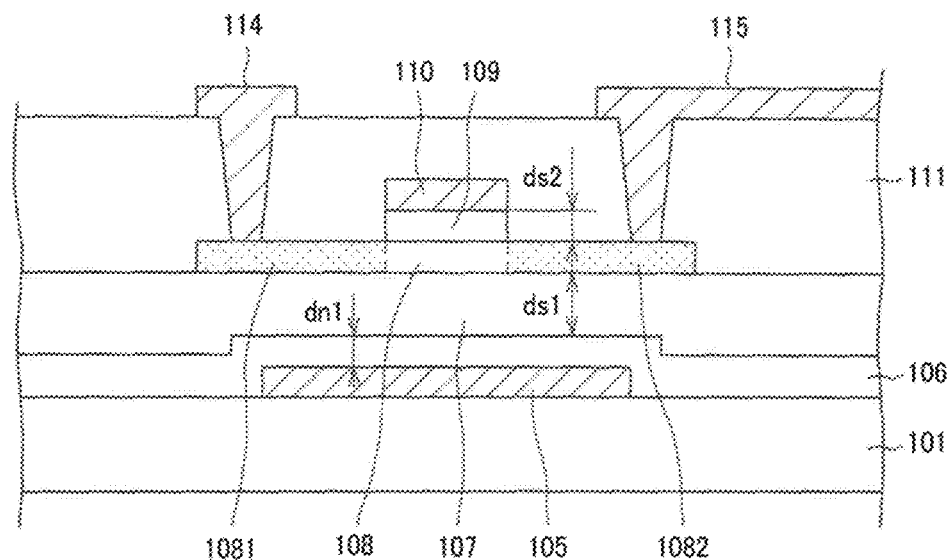
FIG. 8 is a cross sectional view of a third example of embodiment 1.

FIG. 8 is a cross sectional view of the TFT according to a third example of embodiment 1. In FIG. 8, the second gate insulating film 109 is formed only on the channel portion of the oxide semiconductor film 108; the second gate insulating film 109 does not cover the drain 1081 and the source 1082 of the oxide semiconductor film 108. The structure of FIG. 8 is formed as follows. The second gate insulating film 109 is formed covering the oxide semiconductor film 108; the manufacturing method for the second gate insulating film 109 is the same as explained in FIG. 4; after that, the second gate electrode 110 is formed; then, the gate insulating film 109 is patterned using the second gate electrode 110 as the mask.

After that, the uncovered oxide semiconductor film is exposed to the silane $SiH_4$ gas to reduce the oxide semiconductor film 108, except the area that is covered by the second gate electrode 110, to form the drain 1081 and the source 1082 in the oxide semiconductor film 108. Subsequently, the oxide semiconductor film 108 is covered by the interlayer insulating film 111. The interlayer insulating film 111 is preferably made of e.g. SiN film so that it can supply hydrogen to the drain 1081 and the source 1082 of the oxide semiconductor film 108 to suppress an increase in the resistances of the drain 1081 and the source 1082 by reducing them.

Even when the interlayer insulating film 111 is formed by SiO film, the SiO film, different from the first gate insulating film 107, should be the film that does not supply oxygen. The reason is that: if oxygen is supplied to the drain 1081 and the source 1082 of the oxide semiconductor film 108, their resistances increase, consequently, ON current of the TFT is decreased. The SiO film that does not supply oxygen can be formed by the CVD of the same condition as the second gate insulating film 109 is formed. The operation of the TFT of FIG. 8 is the same as explained in FIG. 4. The interlayer insulating film 111 can be a laminated film of the SiO film and the SiN film.

Figure 9:
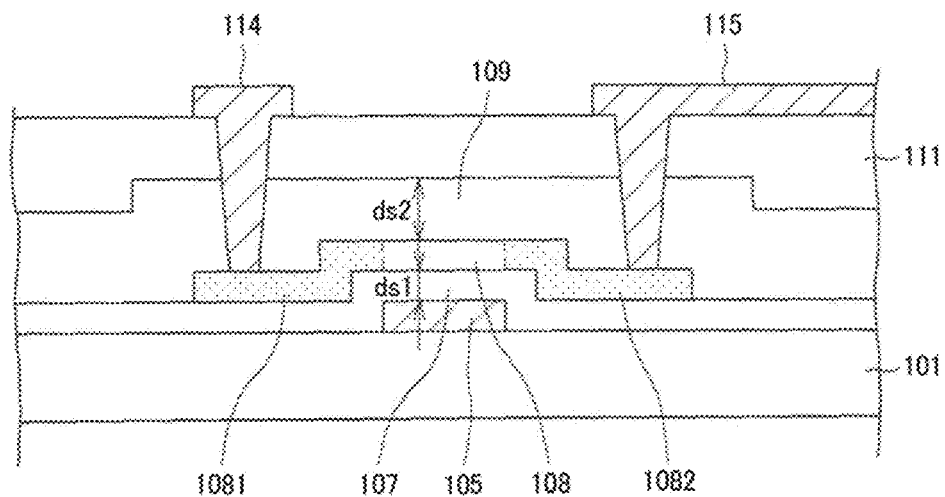
FIG. 9 is a cross sectional view of a fourth example of embodiment 1.

FIG. 9 is a cross sectional view of the TFT of the oxide semiconductor 108 according to a fourth example of embodiment 4. FIG. 9 is a bottom gate type TFT. In FIG. 9, the first gate electrode 105 is formed on the undercoat film 101. The first gate insulating film 107 is formed covering the first gate electrode 105; the oxide semiconductor film 108 is formed on the first gate insulating film 107.

The drain 1081 and the source 1082 of the oxide semiconductor film 108 are formed as that: the resist is formed on the channel region and ions as phosphorus (P), Boron (B), or Argon (Ar), etc. are doped by ion implantation in the region of the drain 1081 and the source 1082. After that, the second gate insulating film 109 is formed; then the interlayer insulating film 111 is formed covering the second gate insulating film 109. In the structure of FIG. 9, the interlayer insulating film 111 can be omitted.

Since the structure of the TFT in FIG. 9 is a bottom gate type, the first gate insulating film 107 is formed by the SiO film that has less lattice defects. Therefore, the fluctuation of the characteristics of the TFT due to the change in characteristics of the gate insulating film can be suppressed. In FIG. 9, the second gate insulating film 109 is formed by the SiO film that has a lot of lattice defects to supply oxygen to the channel of the oxide semiconductor film 108. In FIG. 9, a thickness ds2 of the second gate insulating film 109 is twice or more of a thickness ds1 of the first gate insulating film 107. The thickness of the second gate insulating film 109 is preferably 200 nm or more to supply enough oxygen to the channel of the oxide semiconductor film 108.

Figure 10:
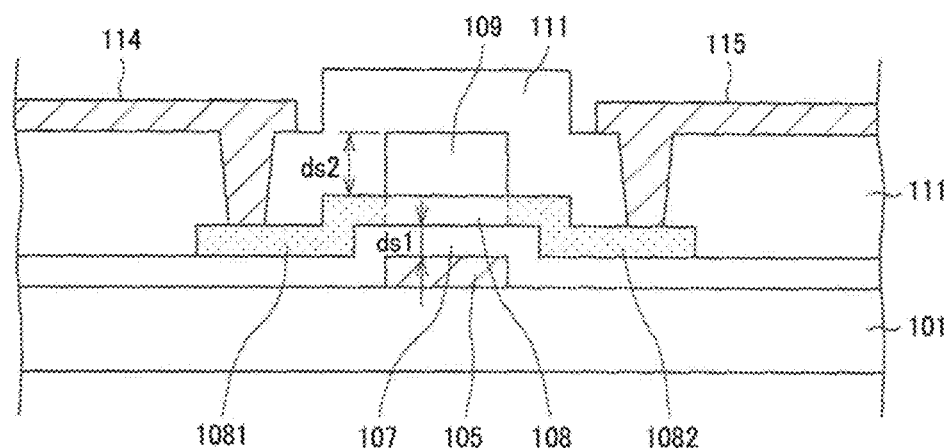
FIG. 10 is a cross sectional view of a fifth example of embodiment 1.

FIG. 10 is a cross sectional view of the TFT according to fifth example of embodiment 1. FIG. 10 is a bottom gate type TFT, too. FIG. 10 differs from FIG. 9 in that: the second gate insulating film 109 is eliminated except the channel region of the oxide semiconductor film 108. The second gate insulating film 109 of FIG. 9 and FIG. 10 is formed by SiO film that has a lot of lattice defects, thus, a lot of oxygen is supplied to the channel of the oxide semiconductor film 108; consequently, the characteristics of the channel of the oxide semiconductor film 108 can be stabilized.

The structure of FIG. 9, however, has the second gate insulating film 109, which supplies a lot of oxygen, on the drain 1081 and the source 1082 of the oxide semiconductor film 108; therefore, oxygen is supplied to the drain 1081 and the source 1082 in a long time, consequently, there is a chance that the resistances of the drain 1081 and the source 1082 increase.

In the structure of FIG. 10, however, the second gate insulating film is eliminated from the drain 1081 and the source 1082 of the oxide semiconductor film 108; therefore, a supply of oxygen from the second gate insulating film 109 is avoided. Consequently, increase in the resistance of the drain 1081 and the source 1081 of the oxide semiconductor film 108 can be avoided.

The relation between the thickness ds1 of the first gate insulating film 107 and the thickness ds2 of the second gate insulating film 109 is the same as explained in FIG. 9. According to the structure of FIG. 10, the resistances of the drain 1081 and the source 1082 of the oxide semiconductor 108 do not increase even when a supply of oxygen from the second gate insulating film 109 is increased by increasing the thickness of the second gate insulating film 109; therefore, the bottom gate type TFT of the oxide semiconductor 108 having higher reliability can be realized.

Figure 11:
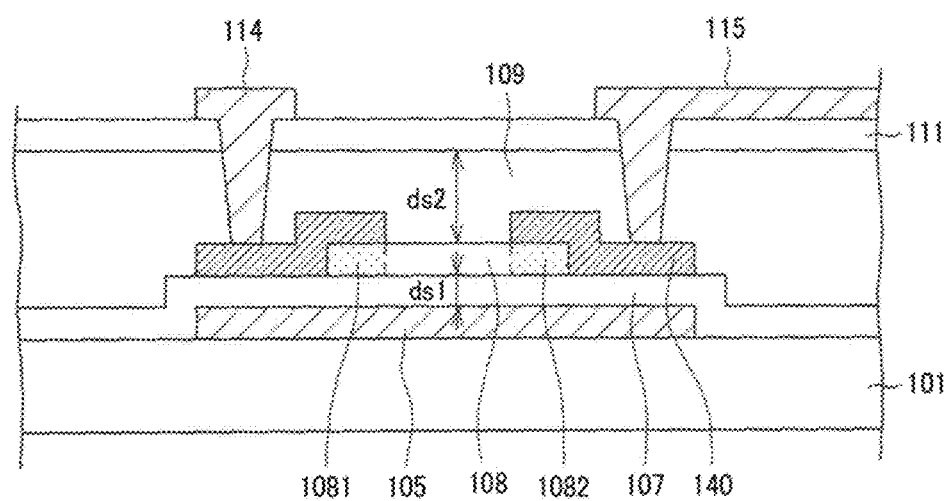
FIG. 11 is a cross sectional view of a sixth example of embodiment 1.

FIG. 11 is a cross sectional view of the TFT according to a sixth example of embodiment 1. In FIG. 11, the first gate electrode 105 is formed on the undercoat film 101; the first gate insulating film 107 is formed covering the first gate electrode 105. The oxide semiconductor film 108 is formed on the first gate insulating film 107; the etching stoppers 140 are formed on the drain 1081 and the source 1082 of the semiconductor film 108. After that, the second gate insulating film 109 is formed; and the interlayer insulating film 111 is formed covering the second gate insulating film 109. The relation between the thickness ds1 of the first gate insulating film 107 and the thickness ds2 of the second gate insulating film 109 is the same as explained in FIG. 9.

Embodiment 2

The TFT of the oxide semiconductor 108 has the characteristics that the leak current is low. This means the voltage of the pixel electrode can be maintained in a long period. Therefore, low frequency operation can be possible by adopting the TFT of the oxide semiconductor 108, consequently, power consumption can be decreased. However, mobility of carriers of the oxide semiconductor film 108 may not be enough to constitute the peripheral driving circuit as the scan line driving circuit.

On the other hand, mobility of carriers in the LTPS is high. The LTPS, however, has high leak current compared with the oxide semiconductor. Therefore, it is reasonable to use the TFTs of the oxide semiconductor for the switching transistor or the driving transistor in the pixel, and to use the TFTs of the LIPS in the peripheral driving circuit. This structure is called a hybrid structure.

Figure 12:
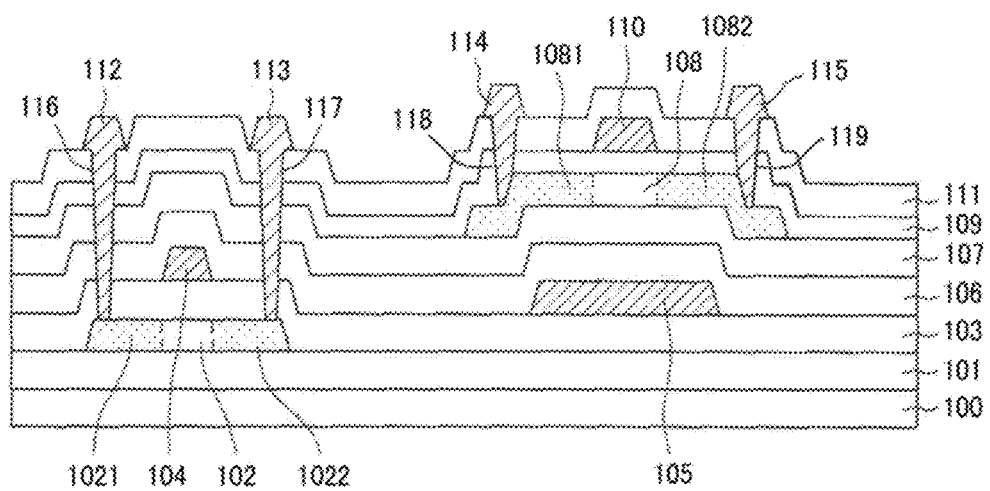
FIG. 12 is a cross sectional view of embodiment 2.

FIG. 12 is a cross sectional view that the TFT of the semiconductor 108 and the TFT of the LIPS 102 are formed on the same substrate 100. The TFT of the oxide semiconductor 108 is formed in the display area and the TFT of the LIPS 102 is formed in the peripheral driving circuit, therefore, those TFTs are set apart in the actual device; however, those TFTs are set side by side just for easy perception of layer structures in FIG. 12.

In FIG. 12, the TFT of the LIPS 102 is on the left hand side and the TFT of the oxide semiconductor 108 is on the right hand side. The TFT of the oxide semiconductor 108 is represented by the structure of FIG. 4, however, the TFT of the oxide semiconductor 108 of other examples in embodiment 1 can also be applicable.

In FIG. 12, the TFT substrate 100 made of polyimide is formed on the glass substrate 90; the undercoat film 101 is formed on the TFT substrate 100. The structure of the undercoat film 101 is the same as explained in FIG. 2. The semiconductor film 102 of the LIPS is formed on the undercoat film 101. The LIPS film 102 is formed as that: the a-Si film is formed by CVD on the undercoat film 101; the excimer laser is applied on the a-Si film, and then, the a-Si film is converted to the poly-silicon film. The LIPS film 102 is formed in a thickness of 50 nm.

The third gate insulating film 103 is formed on the LIPS film 102; the third gate electrode 104 is formed on the third gate insulating film 103. The third gate electrode 104 is made of a metal or an alloy as Mo, MoW, and so forth, or a laminated film of Ti—Al—Ti. In FIG. 12, the channel is formed in the LIPS film 102 at the region corresponding to the third gate electrode 104, the drain 1021 or the source 1022 is formed at the both side of the channel. The drain 1021 and the source 1022 are formed by doping the Phosphorus (P) or Boron (B) in the oxide semiconductor film 108 by ion implantation by using the third gate electrode 104 as the mask.

At the same time of forming the third gate electrode 104, the first gate electrode 105 for the TFT of the oxide semiconductor 108 is formed. The TFT of the oxide semiconductor 108 is formed above the first gate electrode 105; the structure of the TFT of the oxide semiconductor 108 is the same as explained in FIG. 4. Namely, the barrier film 106 is formed covering the first gate electrode 105 and the third gate electrode 104. As explained in FIG. 3, the barrier film 106 protect the oxide semiconductor film 108 from moisture intruding from e.g. substrate 100. In addition, since the SiN film is a source of hydrogen, the SiN film supplies hydrogen to the TFT on the left hand side (the TFT of the LTPS) to stabilize the characteristics of the polysilicon.

The first gate insulating film 107, which is for the oxide semiconductor film 108, is formed on the barrier film 106. If hydrogen reaches to the oxide semiconductor film 108, the oxide semiconductor film 108 is reduced and its characteristics are changed, therefore, the first gate insulating film 107, which is made of SiO film, prevents the influence of the barrier film 106, which is made of SiN film. The first gate insulating film 107 has a lot of lattice defects and is made thick; thus, it can be a source of oxygen for the oxide semiconductor film 108, which is formed on the first gate insulating film 107.

The oxide semiconductor film 108 is formed on the first gate insulating film 107. The structure of the oxide semiconductor film 108 is the same as explained in FIG. 3 and FIG. 4. The second gate insulating film 109 is formed on the oxide semiconductor film 108. The second gate insulating film 109 is a dense SiO film, which has less lattice defects; therefore, a fluctuation in characteristics of the second gate insulating film 109 is low.

After that, the second gate electrode 110 is formed on the second gate insulating film 109; the drain 1081 and the source 1082 are formed in the oxide semiconductor film 108 by ion implantation using the second gate electrode 110 as the mask. Subsequently, the interlayer insulating film 111 is formed over the second gate insulating film 109 and the second gate electrode 110. The interlayer insulating film 111 is made of the SiN film or the SiO film of less lattice defects or a lamination of the SiN film and the SiO film.

After that, the through holes 116 and 117 are formed for the TFT of the LTPS 102 through the five layers of the insulating films, namely, the interlayer insulating film 111, the second gate insulating film 109, the first gate insulating film 107, the barrier film 106 and the first gate insulating film 103 to connect the drain 1021 and the drain electrode 112 and to connect the source 1022 and the source electrode 113. On the other hand, the through holes 118 and 119 are formed for the TFT of the oxide semiconductor 108 through the interlayer insulating film 111 and the second gate insulating film 109 to connect the drain 1081 and the drain electrode 114 and to connect the source 1082 and the source electrode 115.

As a result, the TFT substrate, which has a hybrid structure, is completed. Subsequently, the elements depicted in FIG. 3 are formed to complete the organic EL display device.

Figure 13:
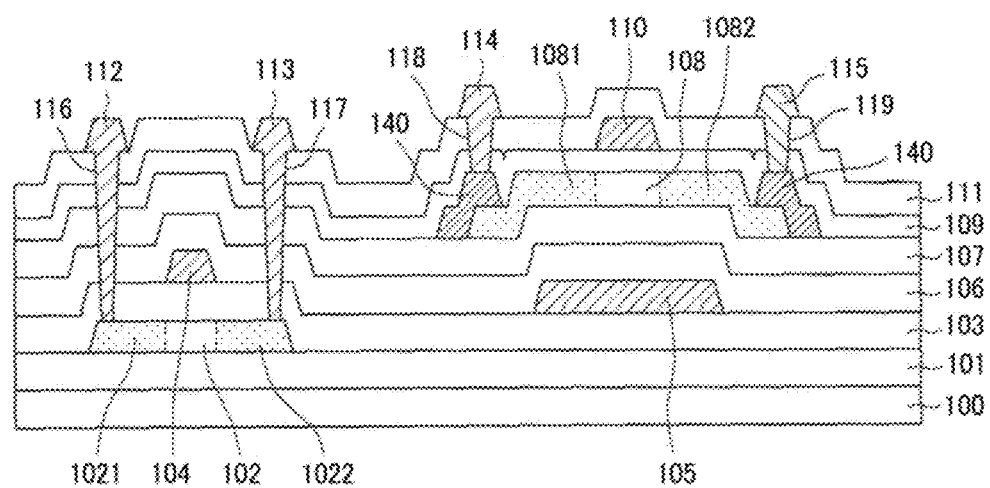
FIG. 13 is a cross sectional view of a second example of embodiment 2.

FIG. 13 is a second example of embodiment 2. FIG. 13 differs from FIG. 12 in that the structure of FIG. 13 has etching stoppers 140, which are formed on the drain 1081 and the source 1082 of the oxide semiconductor film 108. The etching stoppers 140 are made of e.g. a metal. The drain electrode 114 connects with the drain 1081 via the metal 140, and the source electrode 115 connects with the source 1082 via the metal 140. The reason why the etching stopper is formed is as follows.

In FIG. 12, the through holes 116 and 117 for the LTPS film 102 and the through holes 118 and 119 for the oxide semiconductor film 108 are formed simultaneously. When the through holes for the LTPS film 102 are formed, the through holes 116 and 117 must be cleansed by hydrofluoric acid (HF). The through holes 118 and 119 for the oxide semiconductor film 108 are also cleansed simultaneously. The oxide semiconductor film 108, however, is easily dissolved in the hydrofluoric acid; therefore, the oxide semiconductor film 108 disappear at the through holes 118 and 119.

In the structure of FIG. 13, since the etching stopper made of metal is formed at the bottoms of the through hoes 118 and 119, the disappearance of the oxide semiconductor film 108 at the through holes 118 and 119 is avoided.

Figure 14:
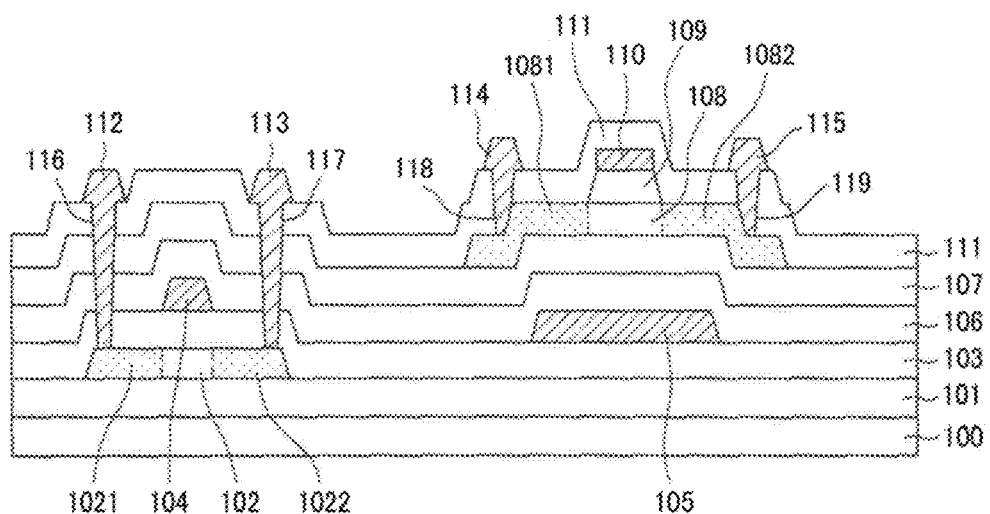
FIG. 14 is a cross sectional view of a third example of embodiment 2.

FIG. 14 is a third example of embodiment 2. The TFT of the LTPS 102 on the left hand side is the same as the one in FIG. 12. The TFT of the oxide semiconductor film 108 on the right hand side, the second gate insulating film 109 is formed in island shape on the channel region of the oxide semiconductor film 108. This structure is the same as explained in FIG. 8 in embodiment 1. Namely, the structure explained in FIG. 8 is also effective in the hybrid structure of FIG. 14.

In FIG. 14, the through holes 116 and 117 for the TFT of the LTPS 102 are formed through the four insulating films, namely, the interlayer insulating film 111, the first insulating film 107, the barrier film 106, and the third gate insulating film 103; the through holes 118 and 119 for the TFT of the oxide semiconductor 108 are formed in the interlayer insulating film 111. As explained in FIG. 13, the through holes 116, 117 and the through holes 118, 119 are formed simultaneously. When the through holes 116 and 117 for the LIPS film 102 are formed, those through holes are cleansed by hydrofluoric acid (HF). The through holes 118 and 119 for the oxide semiconductor film 108 are also cleansed simultaneously. The oxide semiconductor film 108, however, is easily dissolved in the hydrofluoric acid; therefore, the oxide semiconductor film 108 disappear at the through holes 118 and 119.

Figure 15:
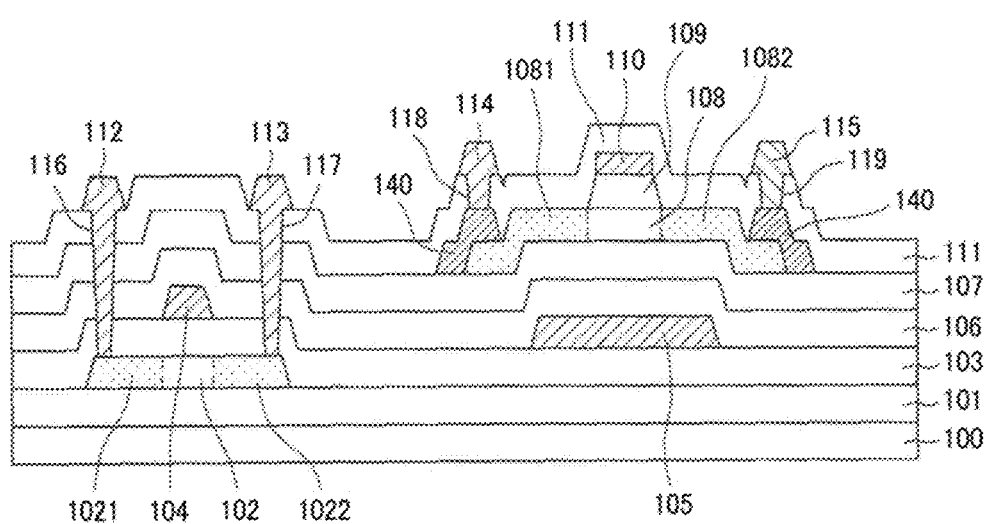
FIG. 15 is a cross sectional view of a fourth example of embodiment 2.

The structure of FIG. 15, to avoid this problem, provides the etching stoppers 140 made of e.g. metal on the drain 1081 and the source 1082 of the oxide semiconductor film 108. As a result, the disappearance of the oxide semiconductor film 108 at the through holes 118 and 119 can be avoided. Other structures of FIG. 15 is the same as FIG. 14.

In the present embodiment, the structure of the TFT of the oxide semiconductor 108 has been explained according to example 1 and example 3 of embodiment 1; however, other examples of the TFT of the oxide semiconductor film 108 in embodiment 1 can also be applicable in the hybrid structure.

Embodiment 3

Figure 16:
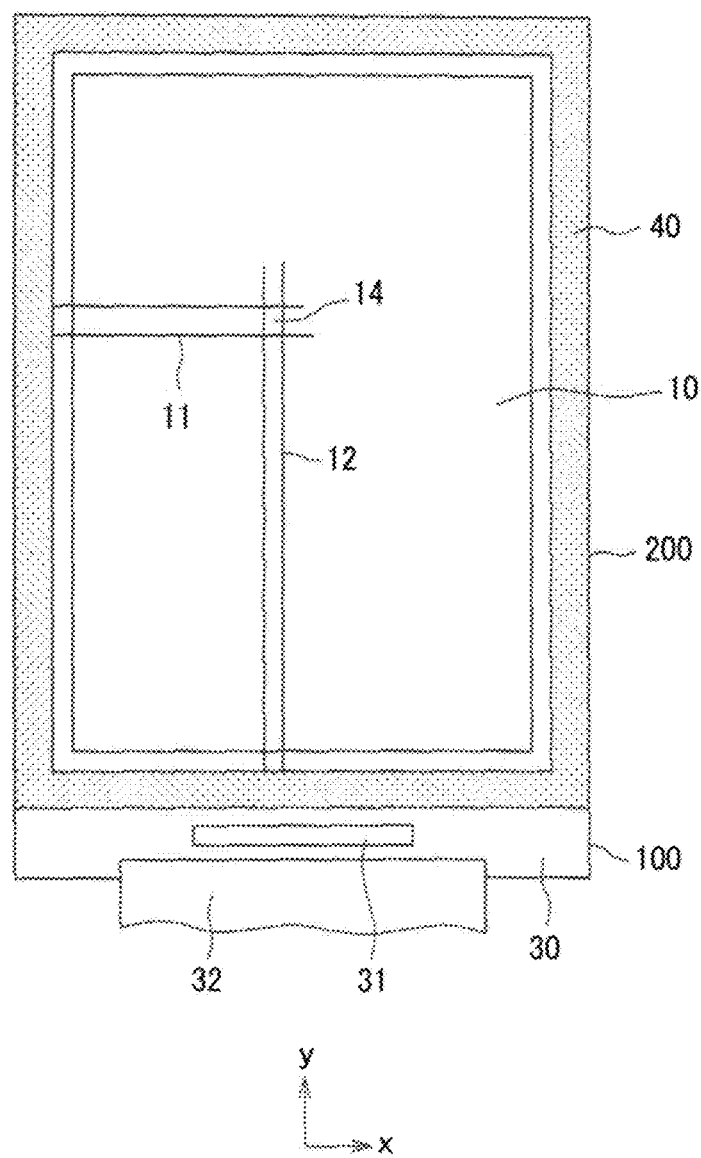
FIG. 16 is a plan view of the liquid crystal display device.

In embodiments 1 and 2, the present invention is explained when it is applied to the organic EL display device. The present invention is, however, applicable to the liquid crystal display device. FIG. 16 is a plan view of the liquid crystal display device. In FIG. 16, the TFT substrate 100 and the counter substrate 200 are adhered by the sealant 40 and the liquid crystal is sealed inside. The display area 10 is formed in the area that the TFT substrate 100 and the counter substrate 200 overlap with each other. In the display area 10, the scan lines 11 extend in the lateral direction (x direction) and are arranged in the longitudinal direction (y direction); the video signal lines 12 extend in the longitudinal direction (y direction) and are arranged in the lateral direction (x direction). The pixel 14 is formed in the area surrounded by the scan lines 11 and the video signal lines 12.

The terminal area 30 is formed on a portion of the TFT substrate 100, with which the counter substrate 200 does not overlap. The driver IC 31 is installed on the terminal area 30; the flexible wiring substrate 32 connects to the terminal area 30.

Figure 17:
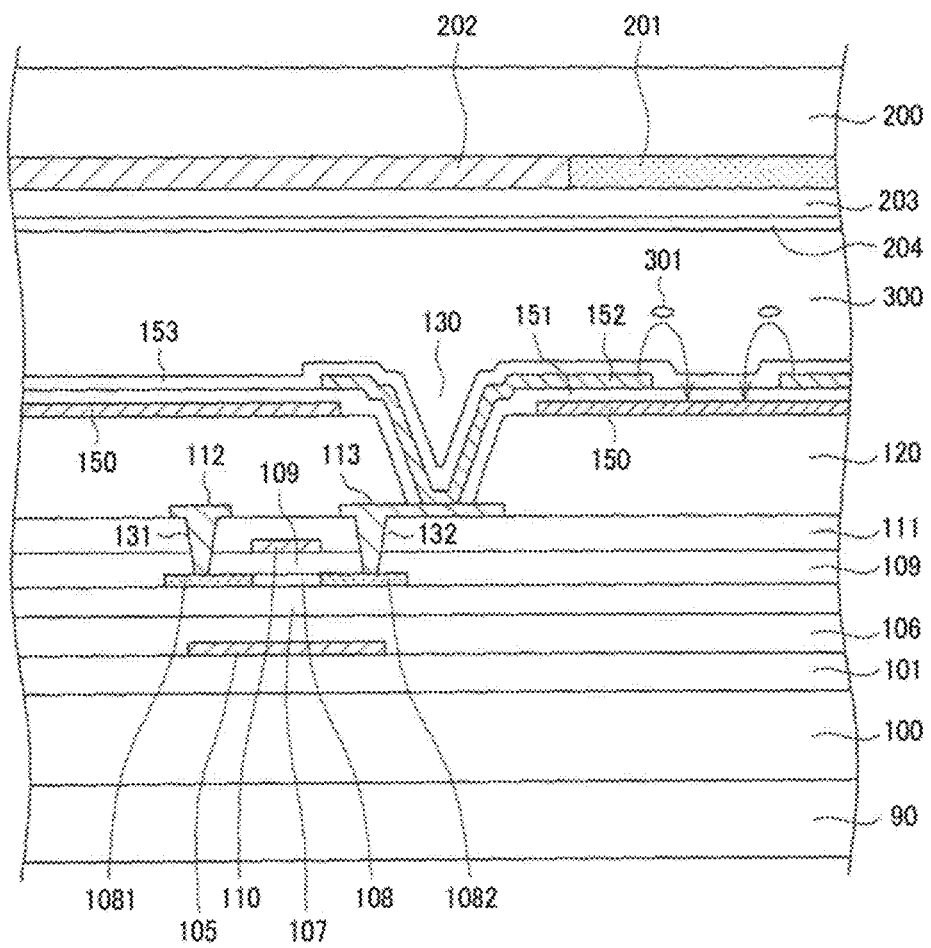
FIG. 17 is cross sectional view of the display area of the liquid crystal display device.

FIG. 17 is a cross sectional view of the display area 10 of the liquid crystal display device. The TFT in FIG. 17 is a switching TFT, however, cross sectional structure is the same as the driving TFT in FIG. 2. Namely, the TFT is a top gate type TFT, the oxide semiconductor film 108 is used for the semiconductor film. In FIG. 17, the structures, including the TFT, are the same up to the organic passivation film 120 as the structure of FIG. 3.

In FIG. 17, the common electrode 150 made of ITO is formed in a plane shape on the organic passivation film 120; the capacitive insulating film 151, made of SiN film, is formed covering the common electrode 150. The pixel electrode 152, made of ITO, is formed on the capacitive insulating film 151. The plan view of the pixel electrode 152 is a comb like shape. The alignment film 153, which controls intimal alignment of the liquid crystal molecules 301, is formed covering the pixel electrode 152.

When video signal is applied to the pixel electrode 152, the lines of forces are generated between the pixel electrode 152 and the common electrode 150 as depicted by arrows in FIG. 17; consequently, the liquid crystal molecules 301 are rotated, thus, light transmittance in the pixel is controlled. In addition, the pixel capacitance is formed between the pixel electrode 152 and the common electrode 150 sandwiching the pixel insulating film 151.

In FIG. 17, the counter substrate 200 is disposed opposing to the TFT substrate 100, sandwiching the liquid crystal layer 300; the color filter 201 and the black matrix 202 are formed inside of the counter substrate 200. The overcoat film 203 is formed covering the color filter 201 and the black matrix 202. The alignment film 204 is formed covering the overcoat film 203.

In FIG. 17, the TFT substrate 100 and the counter substrate 200 are made of resin as polyimide. In the manufacturing process, the TFT substrate 100 of polyimide is formed on the glass substrate 90; however, when the liquid crystal display device is completed, the glass substrate 90 is removed by e.g. laser abrasion.

The merit of using the TFT of the oxide semiconductor 108 for the liquid crystal display device is the same as for the organic EL display device explained in embodiment 1. The merit of using the TFT of the oxide semiconductor 108 in the hybrid structure for the liquid crystal display device is the same as in the hybrid structure for the organic EL display device explained in embodiment 2.

What is claimed is:

1. A manufacturing method of a display device having a substrate including a display area, in which plural pixels are formed, each of the pixels including a TFT having an oxide semiconductor film comprising:
forming a first insulating film in contact with a first side of the oxide semiconductor film,
forming a second insulating film in contact with a second side of the oxide semiconductor film,
forming the first insulating film by a first CVD, in which the substrate is in a first temperature,
forming the second insulating film by a second CVD, in which the substrate is in a second temperature,
wherein the second temperature is higher than the first temperature,
the first temperature of the first CVD is 200 to 250 centigrade, and
the second temperature of the second CVD is 300 to 350 centigrade.

2. A manufacturing method of a display device having a substrate including a first thin film transistor having a polysilicon semiconductor film, and a second thin film transistor having an oxide semiconductor film comprising:

forming the first thin film transistor at first, subsequently, forming a first gate insulating for the second thin film transistor, which is formed at different place from the first thin film transistor in a plan view, by a first CVD, in which the substrate is in a first temperature, forming the oxide semiconductor film on the first gate insulating film, forming a second gate insulating film on the oxide semiconductor film by a second CVD, in which the substrate is in a second temperature, wherein the second temperature is higher than the first temperature, the first temperature of the first CVD is 200 to 250 centigrade, and the second temperature of the second CVD is 300 to 350 centigrade.

3. The manufacturing method of the display device according to claim 2, forming a first gate electrode for the second thin film transistor on a side of the first gate insulating film, forming a second gate electrode for the first thin film transistor, the first gate insulating film and the second gate insulating film are formed by a same material and are formed simultaneously.

\* \* \* \* \*